(12) United States Patent
Wang

(10) Patent No.: US 11,990,426 B2
(45) Date of Patent: May 21, 2024

(54) SEMICONDUCTOR STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/451,393

(22) Filed: Oct. 19, 2021

(65) Prior Publication Data
US 2022/0320011 A1 Oct. 6, 2022

Related U.S. Application Data

(63) Continuation of application No. PCT/CN2021/109541, filed on Jul. 30, 2021.

(30) Foreign Application Priority Data

Apr. 2, 2021 (CN) .......................... 202110361612.3

(51) Int. Cl.
*H01L 23/00* (2006.01)
*H01L 21/768* (2006.01)
*H01L 23/48* (2006.01)
*H01L 23/522* (2006.01)

(52) U.S. Cl.
CPC ...... *H01L 23/562* (2013.01); *H01L 21/76898* (2013.01); *H01L 23/481* (2013.01)

(58) Field of Classification Search
CPC ............. H01L 23/562; H01L 21/76898; H01L 23/481; H01L 23/522; H01L 23/5225
See application file for complete search history.

(56) References Cited

U.S. PATENT DOCUMENTS

| | | | |
|---|---|---|---|
| 8,642,430 B2 | 2/2014 | Flachowsky | |
| 8,883,634 B2 | 11/2014 | Yu | |
| 9,214,374 B2 | 12/2015 | Lee | |
| 9,705,009 B2 | 7/2017 | Arai et al. | |
| 2012/0292746 A1 | 11/2012 | Lee | |
| 2013/0001793 A1* | 1/2013 | Yu | B81B 3/0072 257/774 |

(Continued)

FOREIGN PATENT DOCUMENTS

| CN | 103552980 A | 2/2014 |
|---|---|---|
| CN | 103578996 A | 2/2014 |

(Continued)

*Primary Examiner* — Herve-Louis Y Assouman
(74) *Attorney, Agent, or Firm* — Syncoda LLC; Feng Ma

(57) ABSTRACT

A semiconductor structure has a first area, a second area and a third area. The second area is arranged between the first area and the third area. The semiconductor structure includes: a substrate; a shallow trench isolation structure arranged in the substrate and configured to isolate the substrate into a plurality of active areas, in which the active areas in the first area form a semiconductor device; a dielectric layer arranged on the substrate; a through hole structure arranged in the third area and penetrating through the dielectric layer and the substrate; and a stress buffer structure arranged in the second area and including a first buffer doped area, in which the first buffer doped area is arranged in the active areas and formed by doping the active areas with a first buffer impurity.

16 Claims, 7 Drawing Sheets

(56) References Cited

U.S. PATENT DOCUMENTS

| | | | |
|---|---|---|---|
| 2013/0267078 A1 | 10/2013 | Flachowsky | |
| 2014/0284690 A1 | 9/2014 | Arai et al. | |
| 2015/0228555 A1 | 8/2015 | Rabie et al. | |
| 2015/0340314 A1* | 11/2015 | Kim | H01L 23/481 |
| | | | 257/773 |

FOREIGN PATENT DOCUMENTS

| | | |
|---|---|---|
| CN | 104835781 A | 8/2015 |
| IN | 103367114 A | 10/2013 |

\* cited by examiner

SEMICONDUCTOR STRUCTURE

CROSS-REFERENCE TO RELATED APPLICATIONS

This application is a continuation application of International Patent Application No. PCT/CN2021/109541, filed on Jul. 30, 2021, entitled "Semiconductor Structure", which claims priority to Chinese patent application No. 202110361612.3, filed to the China National Intellectual Property Administration on Apr. 2, 2021 and entitled "Semiconductor Structure". The contents of International Patent Application No. PCT/CN2021/109541 and Chinese Patent Application No. 202110361612.3 are hereby incorporated by reference in their entirety.

BACKGROUND

A Through Silicon Via (TSV) technology used in three-dimensional packaging can effectively shorten the length of interconnected wires, reduce signal transmission delay and loss, improve signal speed and bandwidth, reduce power consumption, reduce packaging volume and the like. It is one of the effective ways to realize high-performance and high-reliability semiconductor devices.

SUMMARY

The application relates to the technical field of integrated circuits, and in particular relates to a semiconductor structure.

According to various embodiments of the application, a semiconductor structure is provided.

The semiconductor structure is provided with a first area, a second area and a third area, the second area is arranged between the first area and the third area, and the semiconductor structure includes a substrate, a shallow trench isolation structure, a dielectric layer, a through hole structure and a stress buffer structure.

The shallow trench isolation structure is arranged in the substrate and configured to isolate the substrate into a plurality of active areas, and the active areas in the first area form a semiconductor device.

The dielectric layer is arranged on the substrate.

The through hole structure is arranged in the third area, and the through hole structure penetrates through the dielectric layer and the substrate.

The stress buffer structure is arranged in the second area and includes a first buffer doped area. The first buffer doped area is arranged in the active areas and formed by doping the active areas with a first buffer impurity. An atomic radius of the first buffer impurity is less than an atomic radius of a material of the substrate.

BRIEF DESCRIPTION OF THE DRAWINGS

In order to describe the technical solutions in the embodiments of the application or a conventional art more clearly, the drawings required to be used in descriptions about the embodiments or the conventional art will be simply introduced below. It is apparent that the drawings described below are only some embodiments of the application. Other drawings may further be obtained by those of ordinary skilled in the art according to these drawings without creative work.

DETAILED DESCRIPTION

Figure 1:
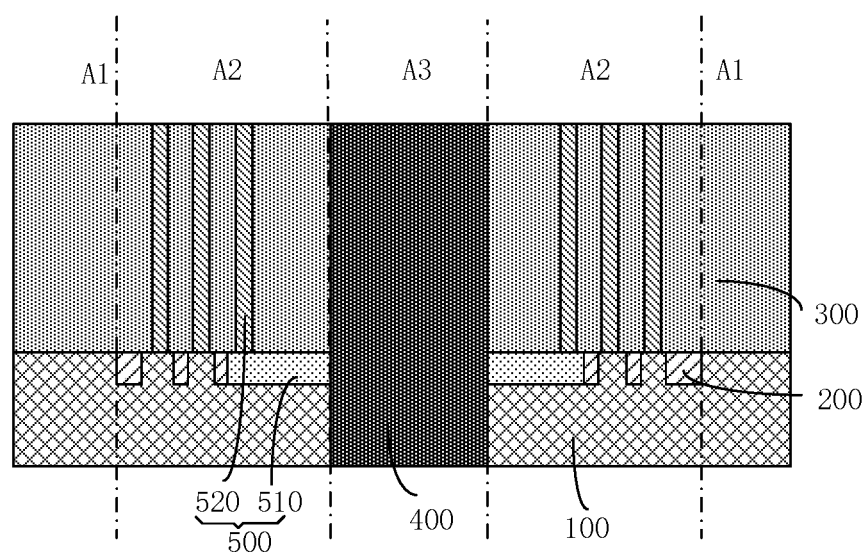
FIG. 1 is a schematic cross-sectional view of a semiconductor structure provided in an embodiment.

In order to make the application convenient to understand, the application will be described more comprehensively below with reference to the related drawings. The drawings show embodiments of the application. However, the application may be implemented in various forms and is not limited to the embodiments described herein. On the contrary, these embodiments are provided to make the contents disclosed in the application understood more thoroughly and comprehensively.

Unless otherwise defined, all technical and scientific terms used herein have the same meanings as commonly understood by those skilled in the art. Herein, terms used in the description of the application are only for the purpose of describing specific embodiments and not intended to limit the application.

It is to be understood that, although various elements, components, areas, layers and the like may be described with the terms first, second, third, etc., these elements, components, areas, layers and the like should not be limited to these terms. These terms are used only to distinguish one element, component, area, layer, doping type or part from another element, component, area, layer, doping type or part. Therefore, a first element, component, area, layer, doping type or part discussed below may be represented as a second element, component, area, layer or part without departing from the teaching of the application. For example, a first buffer doped area may become a second buffer doped area. Similarly, the second buffer doped area may become a first buffer doped area.

The terms regarding spatial relationship, such as "below", "under", "lower", "beneath", "above", and "upper" may be used herein for describing a relationship between one element or feature and another element or feature illustrated in the figures. It is to be understood that, in addition to the orientation shown in the figures, the terms regarding spatial relationship further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. Moreover, the device may include otherwise orientation (such as rotation by 90 degrees or in other orientations) and the spatial wordings used herein may be interpreted accordingly.

As used herein, singular forms "a/an", "one", and "the" may include the plural forms, unless otherwise specified in the context. It is also to be understood that, terms such as "comprising/containing" or "having" appoint existence of declarative features, wholes, steps, operations, components, parts or combinations of them, but not excluding the possibility of existence or adding of one or more other features, wholes, steps, operations, components, parts or combinations of them. Meanwhile, in the specification, term "and/or" includes any and all combinations of the related listed items. It is also to be understood that, terms such as "comprising/containing" or "having" appoint existence of declarative features, wholes, steps, operations, components, parts or combinations of them, but not excluding the possibility of existence or adding of one or more other features, wholes, steps, operations, components, parts or combinations of them.

In the drawings, the dimensions of layers and areas may be exaggerated for clarity. It should be understood that, when a layer or element is referred to as "in" another layer or "on" substrate, the layer or element may be directly on the other layer or substrate, or there may be an intermediate layer. Moreover, it is also understood that, when a layer is referred to as "between" two layers, the layer may be the only layer between the two layers, or there may also be one or more intermediate layers. In addition, the same reference numerals always represent the same elements.

The embodiments of the present application are described referring to a schematic cross section view of an embodiment (and an intermediate structure) of the application herein, so that change of shown shapes due to a manufacturing technology and/or tolerance may be predicted. Therefore, the embodiments of the application should not be limited to specific shapes of shown areas, but including shape deviation due to the manufacturing technology. Therefore, areas shown in the figures are schematic substantially, their shapes do not represent actual shapes of areas of a device, and there is no limitation on the scope of the application.

At present, the TSV manufacturing process usually includes: etching through holes penetrating through a substrate and a dielectric layer on the substrate, and filling electroplated copper with good conductivity in the through holes. After copper plating, annealing treatment is usually performed to make the size of the electroplated copper more uniform, so as to reduce its resistivity and improve its electromigration resistance.

During annealing, the crystal grains of the electroplated copper will grow and become larger. The thermal expansion coefficients of the copper, the substrate and the dielectric layer are significantly different and mismatched with each other. Therefore, thermal stress will be generated in the TSV manufacturing process. The thermal stress will crack the interface between the dielectric layer and the silicon substrate, which will affect the stability of a semiconductor structure.

In an embodiment, referring to FIG. 1, a semiconductor structure is provided. The semiconductor structure is provided with a first area A1, a second area A2 and a third area A3. The second area A2 is arranged between the first area A1 and the third area A3.

The semiconductor structure includes a substrate 100, a shallow trench isolation structure 200, a dielectric layer 300, a through hole structure 400 and a stress buffer structure 500.

The substrate 100 is a semiconductor substrate, and the material of the substrate 100 may include, but is not limited to, silicon.

The shallow trench isolation structure 200 is arranged in the substrate 100 and configured to isolate the substrate 100 into a plurality of active areas, and the active areas in the first area A1 form a semiconductor device (such as a transistor).

The dielectric layer 300 is arranged on the substrate 100, and the material of the dielectric layer 300 may be an insulating material, such as silicon dioxide. Specifically, the dielectric layer 300 may include a plurality of film layers. The materials of the plurality of film layers may be the same or different from each other. Certainly, the dielectric layer 300 may include one film layer, which is not limited in the application.

The through hole structure 400 is arranged in the third area A3. Moreover, the through hole structure 400 penetrates through the dielectric layer 300 and the substrate 100.

In an example, the through hole structure 400 may include an adhesive layer, a barrier layer, a seed layer and a metal conductive structure. At this time, forming the through hole structure 400 may include the following operations.

At S110, a through hole is formed in the substrate 100 and the dielectric layer 300 in the third area A3.

At S120, the adhesive layer, the barrier layer and the seed layer are successively formed in the through hole.

At S130, a metal structure is formed on a surface of the seed layer.

In S110, the substrate 100 and the dielectric layer 300 may be etched through Deep Reactive Ion Etching (DRIE) or laser to form a blind hole in the substrate 100 and the dielectric layer 300.

In S120, the adhesive layer may be an insulating film layer, such as silicon dioxide. The barrier layer may be tantalum or tantalum nitride. The seed layer is a seed film layer of a metal structure, which may facilitate the formation of a good metal structure.

In S130, the material of the metal structure may be copper and other metals with good conductivity. The metal structure may be formed on the surface of the seed layer through electroplating and the like.

After the metal structure is formed, the metal structure may be annealed, so that the size of crystal grain of the metal structure (such as copper formed through electroplating) becomes larger and uniform, so as to reduce its resistivity and improve its electromigration resistance.

The thermal expansion coefficient of the semiconductor substrate 100, the thermal expansion coefficient of the insulating dielectric layer 300 and the thermal expansion coefficient of the metal structure of the through hole structure 400 are significantly different from each other. For example, the material of the substrate 100 is silicon, the material of the dielectric layer 300 is silicon dioxide, and the material of the metal structure of the through hole structure 400 is copper, the thermal expansion coefficient of silicon is $2.6 \times 10^{-6}/°$ C., the thermal expansion coefficient of silicon dioxide is $0.4 \times 10^{-6}/°$ C., and the thermal expansion coefficient of copper is $16.5 \times 10^{-6}/°$ C.

Since the thermal expansion coefficient of the metal structure of the through hole structure 400 is significantly different from the thermal expansion coefficient of the semiconductor substrate 100 and the thermal expansion coefficient of the insulating dielectric layer 300, a relatively large thermal stress is generated in the manufacturing process of the through hole structure 400.

Moreover, in the embodiment, the semiconductor structure may also include a stress buffer structure 500.

The stress buffer structure 500 is arranged in the second area A2. The second area A2 is arranged between the first area A1 and the third area A3. Therefore, the stress buffer structure 500 is arranged between a semiconductor device formed in the first area A1 and the through hole structure 400 in the third area A3.

The stress buffer structure 500 includes a first buffer doped area 510. The first buffer doped area 510 is arranged in the active areas and formed by doping the active areas with a first buffer impurity. The atomic radius of the first buffer impurity is less than the atomic radius of the material of the substrate 100.

In an example, forming the first buffer doped area 510 may include the following operations.

At S210, a substrate 100 is provided, in which a shallow trench isolation structure 200 is formed in the substrate 100, and the shallow trench isolation structure 200 isolates the substrate 100 into a plurality of active areas.

At S220, the active areas in the second area A2 is doped with a first buffer impurity, to form a first buffer doped area 510 doped with the first buffer impurity.

Specifically, the first buffer impurity may be doped in the active areas in the second area A2 by ion implantation or diffusion doping.

When the first buffer impurity is introduced into the active areas of the substrate 100 arranged in the second area A2, the mechanical property of the substrate 100 here will be changed accordingly. The first buffer impurity may replace atoms in the lattice of the material of the substrate, and the replaced atoms of the material of the substrate will parasitize in the lattice, resulting in defects. The first buffer impurities with different atomic sizes will lead to different changes in mechanical properties.

When the atomic radius of the first buffer impurity is less than the atomic radius of the material of the substrate 100, the lattice will shrink when the atoms of the first buffer impurity are in the replacement position of the material of the substrate. There is a local strain around the atoms of each first buffer impurity. The atoms of each first buffer impurity cause the superposition of this local strain. When the doping concentration of the first buffer impurity reaches a certain level, a relatively large overall strain will occur in the whole first buffer doped area 510. This will cause that an undoped area tends to be stretched, that is, subjected to tensile stress. Therefore, the expansion stress between the substrate 100 and a through hole structure 400 may be buffered in the manufacturing process of the through hole structure 400, so that the semiconductor device and structure in the first area A1 may be effectively protected.

In an embodiment, the material of the substrate 100 may include silicon, and the first buffer impurity may include carbon and/or boron. That is, the first buffer doped area 510 is doped with carbon and/or boron. That is, the active areas of the substrate corresponding to the first buffer doped area 510 are doped with carbon and/or boron.

Figure 2:
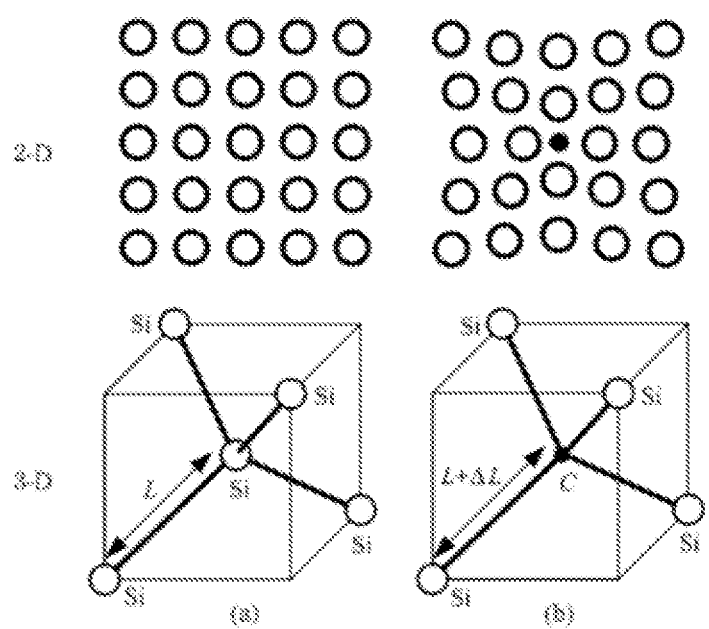
FIG. 2 is a schematic view of a silicon lattice structure and a silicon lattice structure doped with carbon.

Referring to FIG. 2, each of the atomic radius of carbon and the atomic radius of boron is smaller than the atomic radius of silicon atoms. Therefore, when carbon and/or boron are doped in the first buffer doped area 510, the lattice will shrink when the carbon and/or boron atoms are in the replacement position. There is a local strain around each carbon and/or boron atom.

When the doping concentration reaches a certain level, the superposition of this local strain will cause a relatively large overall stress in the whole first buffer doped area 510. This will causes that an undoped area tends to be stretched, that is, subjected to tensile stress. Therefore, the expansion stress generated in the manufacturing process of the through hole structure 400 may be buffered, so that the semiconductor device and structure in the first area A1 may be effectively protected.

In an embodiment, referring to FIG. 1, the first buffer doped area 510 is connected to the through hole structure 400, so that the first buffer doped area 510 may effectively absorb thermal stress between the substrate 100 and the through hole structure 400, and thus the structural stability of the semiconductor structure is improved.

In an example, in the manufacturing process of the semiconductor structure, S220 in the operation of forming the first buffer doped area 510 may include the following operations.

At S221, the active areas in the second area A2 and the active areas in the third area A3 are doped with the first buffer impurity to form a first buffer doped initial area.

Then, when the through hole structure 400 is formed, and a through hole is formed in the substrate 100 and the dielectric layer 300 arranged in the third area A3, the first buffer doped initial area is penetrated by the through hole to form a first buffer doped area 510 which surrounds the through hole structure 400 and which is connected to the through hole structure 400.

At this time, the first buffer doped area 510 with good doping may be formed around the through hole structure 400.

Certainly, in the operation of forming the first buffer doped area 510, only the active areas in the second area A2 may be doped with the first buffer impurity in S220, which is not limited in the application.

Or, in other embodiments, the first buffer doped area 510 may also not be connected to the through hole structure 400.

Furthermore, when the first buffer doped area 510 is connected to the through hole structure 400, the first buffer impurity doped in the first buffer doped area 510 is an impurity which will not cause the first buffer doped area 510 to form a conductive area, so as to effectively prevent the influence on the transmission of an electrical signal in the through hole structure 400.

Figure 3:
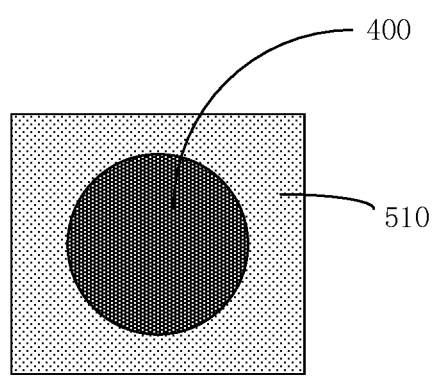
FIG. 3 is a schematic plane view of a through hole structure and a first buffer doped area provided in an embodiment.
Figure 4:
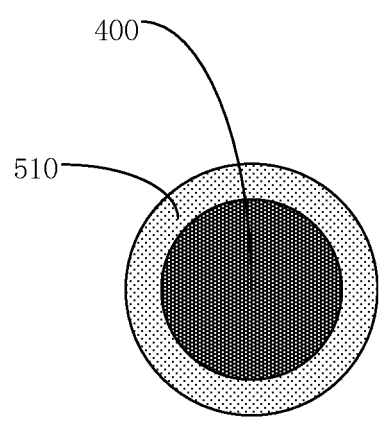
FIG. 4 is a schematic plane view of a through hole structure and a first buffer doped area provided in another embodiment.

In an embodiment, referring to FIG. 3 and FIG. 4, the first buffer doped area 510 surrounds the through hole structure 400. At this time, the first buffer doped area 510 is provided at the periphery of the through hole structure 400 to buffer the thermal stress between the substrate 100 and the through hole structure 400, thereby making the performance of the semiconductor structure more stable.

At this time, the first buffer doped area 510 may be connected to the through hole structure 400, and may also not be connected to the through hole structure 400.

Moreover, the shape of the first buffer doped area 510 is not limited in the application. The first buffer doped area 510 may have a ring shape (referring to FIG. 4), a shape with a square peripheral contour (referring to FIG. 3), or any other possible shape.

Certainly, in other embodiments, the first buffer doped area 510 may also be arranged only in some areas around the through hole structure 400 due to the influence of other semiconductor structures or line structures, which is not limited in the application.

Figure 5:
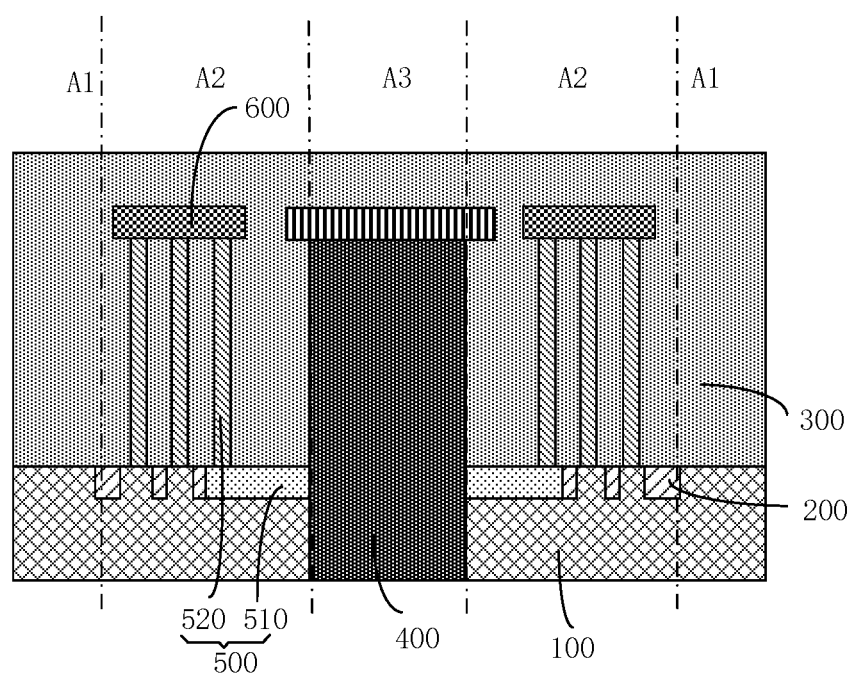
FIG. 5 is a schematic cross-sectional view of a semiconductor structure provided in another embodiment.
Figure 6:
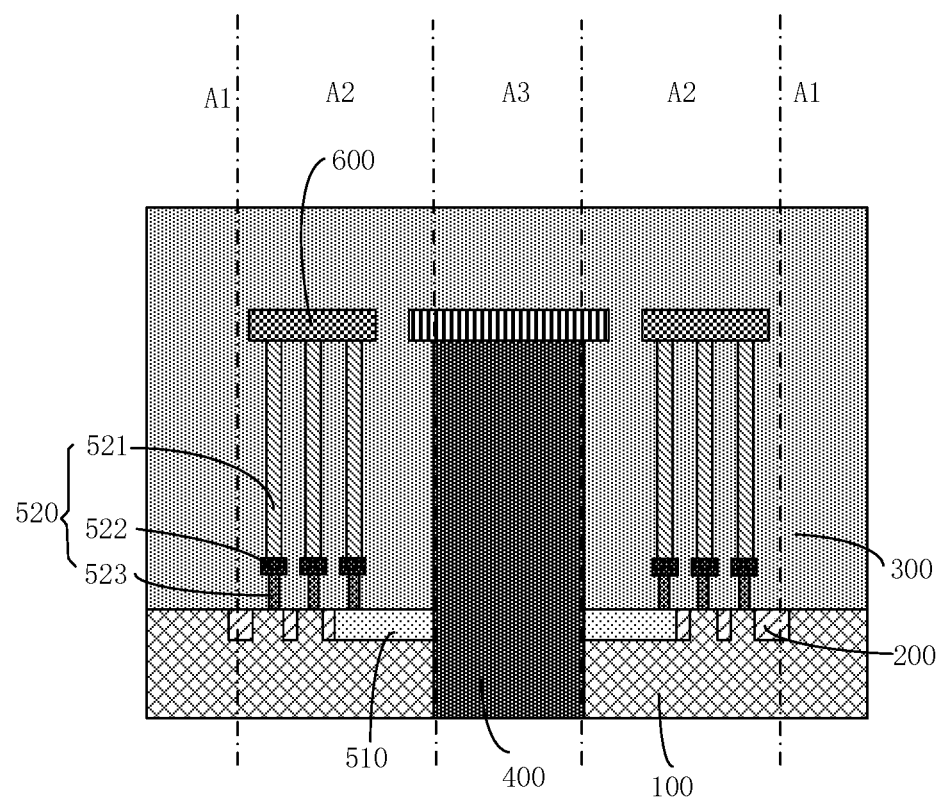
FIG. 6 is a schematic cross-sectional view of a semiconductor structure provided in yet another embodiment.
Figure 7:
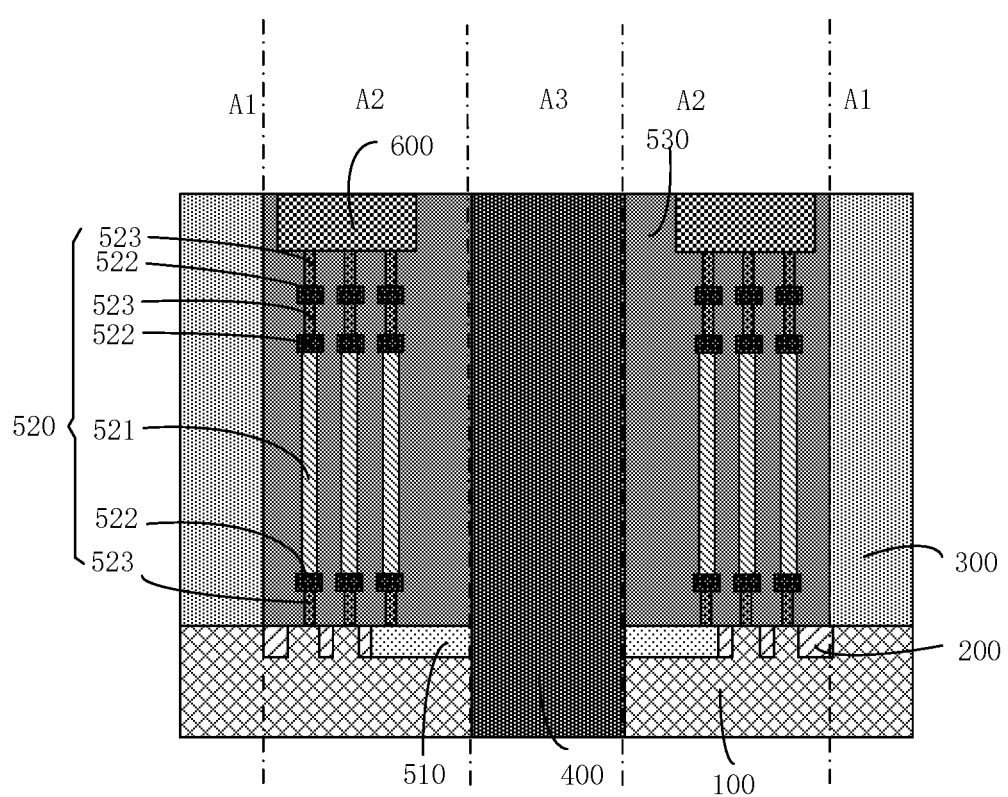
FIG. 7 is a schematic cross-sectional view of a semiconductor structure provided in still another embodiment.

In an embodiment, referring to FIG. 5, FIG. 6 or FIG. 7, the stress buffer structure 500 also includes at least one buffer window structure 520. The buffer window structure 520 is arranged in the dielectric layer 300. Moreover, the buffer window structure 520 may include a buffer through hole structure 521. A buffer through hole of the buffer through hole structure 521 is filled with a metal plug.

The metal plug may effectively prevent the diffusion of the thermal stress when a relatively large thermal stress is generated between the dielectric layer 300 and the through hole structure 400 in the manufacturing process of the through hole structure 400, so as to effectively inhibit the strain generated by the thermal stress.

Meanwhile, there is a spacing between the buffer window structure 520 and the through hole structure 400, so that the buffer window structure 520 does not affect the transmission of a conductive signal in the through hole structure 400.

In an embodiment, the buffer window structure is grounded.

In a three-dimensional integrated circuit, the through hole structure 400 usually is in the form of an array. Especially, in an array of a high-density through hole structure 400, any through hole structure 400 will be subject to the electromagnetic interference of the surrounding through hole structure 400 or cause noise impact on the surrounding components. This will not only cause the transmission loss and transmission delay of the through hole structure 400, but also change the frequency of the surrounding components, etc.

In the embodiment, the buffer window structure 520 is grounded, so that the buffer window structure 520 may also be used for electromagnetic shielding while buffering the thermal stress, so as to reduce the electrical impact of the through hole structure 400 on the surrounding components.

In an embodiment, referring to FIG. 5, the semiconductor structure may also include a grounded metal layer structure 600. The grounded metal layer structure 600 is connected with a circuit grounded end. The first end (the upper end in the figure) of the buffer window structure 520 is connected to the grounded metal layer structure 600, so that the buffer window structure 520 may be conveniently grounded.

In an embodiment, referring to FIG. 5, the second end (the lower end in the figure) of at least one buffer window structure 520 is connected to the active areas.

Since the difference between the thermal expansion coefficient of the semiconductor substrate 100 and the thermal expansion coefficient of the insulating dielectric layer 300 is usually large, the semiconductor substrate 100 and the insulating dielectric layer 300 are also vulnerable to thermal stress.

In the embodiment, the second end of the buffer window structure 520 is connected to the active areas of the substrate 100, so as to effectively inhibit influence of the thermal strain between the substrate 100 and the dielectric layer 300.

In an embodiment, referring to FIG. 5, the second end of at least one buffer window structure 520 is connected to the first buffer doped area 510.

At this time, the first buffer doped area 510 and the buffer window structure 520 may continuously inhibit the thermal stress around the through hole structure 400, so as to improve the buffer capacity of the stress buffer structure 500.

In an embodiment, referring to FIG. 6 or FIG. 7, the buffer window structure 520 may also include at least one buffer metal layer structure 522 and an interconnected through hole structure 523 connected to the metal layer structure 522. The buffer metal layer structure 522 is configured to lead out a signal. Moreover, the interconnected through hole structure 523 is configured to realize the electrical connection between adjacent buffer metal layer structures 522 and the electrical connection between the buffer metal layer structure 522 and other structures (such as the substrate 100).

The buffer through hole structure 521 is connected with the buffer metal layer structure 522, so that the stress buffer range of the buffer window structure 520 may be effectively enlarged.

It should be understood that, in the embodiment, the buffer window structure may include only one buffer metal layer structure 522 and one interconnected through hole structure 523 connected with the one buffer metal layer structure 522, referring to FIG. 6, or the buffer window structure may also include a plurality of buffer metal layer structures 522 and a plurality of interconnected through hole structures 523, referring to FIG. 7.

In an embodiment, the buffer window structure 520 surrounds the through hole structure 400.

At this time, the buffer window structure 520 is provided at the periphery of the through hole structure 400 to buffer the thermal stress between the dielectric layer 300 and the through hole structure 400, thereby making the performance of the semiconductor structure more stable.

Certainly, in other embodiments, the buffer window structure 520 may also be arranged only in some areas around the through hole structure 400 due to the influence of other semiconductor structures or line structures, which is not limited in the application.

In an embodiment, the stress buffer structure 500 may also include a second buffer doped area 520, referring to FIG. 7.

The second buffer doped area 530 is arranged in the dielectric layer 300 and formed by doping the dielectric layer 300 with a second buffer impurity. The dielectric layer 300 is doped with the second buffer impurity to form a porous dielectric material.

The porous dielectric material may effectively absorb thermal stress between the dielectric layer 300 and the through hole structure 400. Therefore, the embodiment may effectively reduce the influence of the thermal stress around the through hole structure 400.

In an example, after the dielectric layer 300 is formed, the dielectric layer 300 in the second area A2 may be doped with buffer impurities in the upper part of the dielectric layer 300 by ion implantation or diffusion doping, so as to form the second buffer doped area 530. The second buffer doped area 530 may be spaced apart from the through hole structure 400, and may also be connected to the through hole structure 400, which is not limited in the application.

In an embodiment, the dielectric constant of the porous dielectric material is lower than the dielectric constant of the material of the dielectric layer 300. At this time, the second buffer doped area 530 may also reduce the parasitic capacitance among the through hole structure 400, the surrounding through hole structure 400 and the metal structure, so as to make the performance of the semiconductor structure more stable.

In an embodiment, the material of the dielectric layer 300 may include silicon dioxide, and the second buffer impurity may include any one or more of boron, phosphorus, boron phosphate and nitrogen.

When boron is doped in silicon dioxide, Boron-doped Silicate Glass (BSG) may be formed. When phosphorus is doped in silicon dioxide, Phosphorus-doped Silicate Glass (PSG) may be formed. When boron phosphate is doped in silicon dioxide, Boron Phosphate-doped Silicate Glass (BPSG) may be formed. When nitrogen is doped in silicon dioxide, silicon oxynitride may be formed.

The BSG, the PSG, the BPSG and the silicon oxynitride are porous dielectric materials. Moreover, the dielectric coefficient of each of the BSG, the PSG, the BPSG and the silicon oxynitride is lower than the dielectric constant of silicon dioxide.

Therefore, in the embodiment, the influence of thermal stress around the through hole structure 400 may be reduced, and the parasitic capacitance among the through hole structure 400, the surrounding through hole structure 400 and the metal structure may also be reduced.

In an embodiment, the second buffer doped area 530 surrounds the through hole structure.

At this time, the buffer window structure 520 is provided at the periphery of the through hole structure 400 to buffer the thermal stress between the dielectric layer 300 and the through hole structure 400, thereby making the performance of the semiconductor structure more stable.

Certainly, in other embodiments, the buffer window structure 520 may also be arranged only in some areas around the through hole structure 400 due to the influence of other semiconductor structures or line structures, which is not limited in the application.

In an embodiment, referring to FIG. 7, the dielectric layer 300 in the second area A2 is filled with the second buffer doped area 530, so that the second buffer doped area 530 may have a sufficient stress buffer range.

The stress buffer structure 500 may also include at least one buffer window structure 520 as described above. Then, the buffer window structure 520 is surrounded by the second buffer doped area 530, so that the stress buffer effect of the stress buffer structure 500 may be greatly enhanced, and thus the thermal stress around the through hole structure 400 may be effectively buffered.

It should be understood that, the embodiment as shown in FIG. 7 is only a reference embodiment. However, the setting form of the second buffer doped area 530 of the application is not limited to this. For example, the second buffer doped area 530 may not be arranged simultaneously with the buffer window structure 520. At this time, the stress buffer structure 500 may only include the second buffer doped area 530 and the first buffer doped area 510.

Moreover, it should be understood that, the specific embodiments of the application are not limited to the forms listed in the above embodiments, but may also have a variety of transformation forms. For example, in some embodiments, the stress buffer structure 500 may only include the first buffer doped area 510 and the second buffer doped area 530. These transformation forms and the embodiments listed above belong to the scope of protection of the application without departing from the concept of the application.

In the descriptions of the specification, the descriptions made with reference to terms "some embodiments", "other embodiments", "ideal embodiments" or the like refer to that specific features, structures, materials or characteristics described in combination with the embodiment or the example are included in at least one embodiment or example of the application. In the specification, schematic description on the above terms not always refers to same embodiments or demonstrations.

Each technical feature of the above mentioned embodiments may be combined freely. For simplicity of description, not all possible combinations of each technical solution in the above mentioned embodiments are described. However, any combination of these technical features shall fall within the scope recorded in the specification without conflicting.

The above mentioned embodiments only express some implementation modes of the application and are specifically described in detail and not thus understood as limits to the patent scope of the application. It is to be pointed out that those of ordinary skill in the art may further make a plurality of transformations and improvements without departing from the concept of the application and all of these shall fall within the scope of protection of the application. Therefore, the scope of patent protection of the application should be subject to the appended claims.

What is claimed is:

1. A semiconductor structure, wherein the semiconductor structure is provided with a first area, a second area and a third area, the second area being arranged between the first area and the third area, the semiconductor structure comprising:
   a substrate;
   a shallow trench isolation structure arranged in the substrate and configured to isolate the substrate into a plurality of active areas, the active areas in the first area forming a semiconductor device;
   a dielectric layer arranged on the substrate;
   a through hole structure arranged in the third area, the through hole structure penetrating through the dielectric layer and the substrate; and
   a stress buffer structure arranged in the second area, the stress buffer structure comprising a first buffer doped area, the first buffer doped area being arranged in the active areas and formed by doping the active areas with a first buffer impurity, an atomic radius of the first buffer impurity being less than an atomic radius of a material of the substrate;
   wherein the stress buffer structure further comprises at least one buffer window structure arranged in the dielectric layer, there is a spacing between the buffer window structure and the through hole structure, the buffer window structure comprises a buffer through hole structure, and a buffer through hole of the buffer through hole structure is filled with a metal plug;
   wherein the buffer window structure is grounded; or wherein a second end of the at least one buffer window structure is connected to the active areas; or wherein a second end of the at least one buffer window structure is connected to the first buffer doped area.

2. The semiconductor structure of claim 1, wherein the material of the substrate comprises silicon, and the first buffer impurity comprises at least one of carbon or boron.

3. The semiconductor structure of claim 1, wherein the first buffer doped area is connected to the through hole structure.

4. The semiconductor structure of claim 1, wherein the first buffer doped area surrounds the through hole structure.

5. The semiconductor structure of claim 1, wherein the semiconductor structure further comprises a grounded metal layer structure, and a first end of the buffer window structure is connected to the grounded metal layer structure.

6. The semiconductor structure of claim 1, wherein the buffer window structure further comprises at least one buffer metal layer structure and an interconnected through hole structure connected to the buffer metal layer structure, and the buffer through hole structure is connected to the buffer metal layer structure.

7. The semiconductor structure of claim 1, wherein the buffer window structure surrounds the through hole structure.

8. The semiconductor structure of claim 1,
   forming the first buffer doped area comprising:
   providing the substrate, the shallow trench isolation structure being formed in the substrate;

doping the active areas in the second area and the active areas in the third area with the first buffer impurity to form a first buffer doped initial area; and penetrating, by a through hole of the through hole structure, the first buffer doped initial area to form the first buffer doped area while forming the through hole of the through hole structure in the substrate and the dielectric layer arranged in the third area, wherein the first buffer doped area surrounds the through hole structure and is connected to the through hole structure.

9. A semiconductor structure, wherein the semiconductor structure is provided with a first area, a second area and a third area, the second area being arranged between the first area and the third area, the semiconductor structure comprising:
a substrate;
a shallow trench isolation structure arranged in the substrate and configured to isolate the substrate into a plurality of active areas, the active areas in the first area forming a semiconductor device;
a dielectric layer arranged on the substrate;
a through hole structure arranged in the third area, the through hole structure penetrating through the dielectric layer and the substrate; and
a stress buffer structure arranged in the second area, the stress buffer structure comprising a first buffer doped area, the first buffer doped area being arranged in the active areas and formed by doping the active areas with a first buffer impurity, an atomic radius of the first buffer impurity being less than an atomic radius of a material of the substrate;
wherein the stress buffer structure further comprises a second buffer doped area arranged in the dielectric layer, the second buffer doped area is formed by doping the dielectric layer with a second buffer impurity, and the dielectric layer is doped with the second buffer impurity to form a porous dielectric material.

10. The semiconductor structure of claim 9, wherein a dielectric constant of the porous dielectric material is lower than a dielectric constant of a material of the dielectric layer.

11. The semiconductor structure of claim 9, wherein the material of the dielectric layer comprises silicon dioxide, and the second buffer impurity comprises one or more of boron, phosphorus, boron phosphate and nitrogen.

12. The semiconductor structure of claim 9, wherein the second buffer doped area surrounds the through hole structure.

13. The semiconductor structure of claim 12, wherein the dielectric layer in the second area is filled with the second buffer doped area.

14. The semiconductor structure of claim 9,
forming the first buffer doped area comprising:
providing the substrate, the shallow trench isolation structure being formed in the substrate;
doping the active areas in the second area and the active areas in the third area with the first buffer impurity to form a first buffer doped initial area; and penetrating, by a through hole of the through hole structure, the first buffer doped initial area to form the first buffer doped area while forming the through hole of the through hole structure in the substrate and the dielectric layer arranged in the third area, wherein the first buffer doped area surrounds the through hole structure and is connected to the through hole structure.

15. A semiconductor structure, wherein the semiconductor structure is provided with a first area, a second area and a third area, the second area being arranged between the first area and the third area, the semiconductor structure comprising:
a substrate;
a shallow trench isolation structure arranged in the substrate and configured to isolate the substrate into a plurality of active areas, the active areas in the first area forming a semiconductor device;
a dielectric layer arranged on the substrate;
a through hole structure arranged in the third area, the through hole structure penetrating through the dielectric layer and the substrate; and
a stress buffer structure arranged in the second area, the stress buffer structure comprising a first buffer doped area, the first buffer doped area being arranged in the active areas and formed by doping the active areas with a first buffer impurity, an atomic radius of the first buffer impurity being less than an atomic radius of a material of the substrate;
wherein the stress buffer structure further comprises at least one buffer window structure arranged in the dielectric layer, there is a spacing between the buffer window structure and the through hole structure, the buffer window structure comprises a buffer through hole structure, and a buffer through hole of the buffer through hole structure is filled with a metal plug;
wherein the buffer window structure further comprises at least one buffer metal layer structure and an interconnected through hole structure connected to the buffer metal layer structure, and the buffer through hole structure is connected to the buffer metal layer structure.

16. The semiconductor structure of claim 15,
forming the first buffer doped area comprising:
providing the substrate, the shallow trench isolation structure being formed in the substrate;
doping the active areas in the second area and the active areas in the third area with the first buffer impurity to form a first buffer doped initial area; and
penetrating, by a through hole of the through hole structure, the first buffer doped initial area to form the first buffer doped area while forming the through hole of the through hole structure in the substrate and the dielectric layer arranged in the third area, wherein the first buffer doped area surrounds the through hole structure and is connected to the through hole structure.

\* \* \* \* \*